United States Patent [19]

Yu et al.

[11] Patent Number: 5,723,893
[45] Date of Patent: Mar. 3, 1998

[54] METHOD FOR FABRICATING DOUBLE SILICIDE GATE ELECTRODE STRUCTURES ON CMOS-FIELD EFFECT TRANSISTORS

[75] Inventors: Douglas Chen-Hua Yu; Pin-Nan Tseng, both of Hsin-Chu, Taiwan

[73] Assignee: Taiwan Semiconductor Manufacturing Company, Ltd., Hsin-Chu, Taiwan

[21] Appl. No.: 656,991

[22] Filed: May 28, 1996

[51] Int. Cl.$^6$ .................... H01L 29/76; H01L 29/56
[52] U.S. Cl. .................... 257/413; 257/316; 257/388; 257/394; 257/408; 257/413; 257/630; 438/180; 438/588; 438/630; 438/655
[58] Field of Search .................... 257/316, 388, 257/394, 408, 413, 630; 438/180, 588, 630, 655

[56] References Cited

U.S. PATENT DOCUMENTS

| | | | |
|---|---|---|---|
| 5,130,266 | 7/1992 | Huang et al. | 437/44 |
| 5,192,992 | 3/1993 | Kim et al. | 257/413 |
| 5,203,957 | 4/1993 | Yoo et al. | 156/643 |

Primary Examiner—Edward Wojciechowicz
Attorney, Agent, or Firm—George O. Saile; Stephen B. Ackerman

[57] ABSTRACT

A method is described for fabricating field effect transistors (FETs) having double silicide gate electrodes and interconnecting lines for CMOS circuits. The method reduces the IR voltage drops and RC time delay constants, and thereby improves circuit performance. The method consists of forming FETs having gate electrodes and interconnecting lines from a multilayer made up of a doped first polysilicon layer, a first silicide layer ($WSi_2$), and a doped second polysilicon layer. After patterning the multilayer to form the gate electrodes, a titanium (Ti) metal is deposited and annealed to form a second silicide layer on the gate electrodes, and simultaneously forms self-aligned Ti silicide contacts on the source/drain areas. The latitude in overetching the contact openings in an insulating (PMD) layer to the gate electrodes extending over the field oxide area is increased, and the contact resistance ($R_c$) is reduced because of the presence of the $WSi_2$ below the contact openings, even if the Ti silicide is completely removed during the contact etching.

29 Claims, 2 Drawing Sheets

METHOD FOR FABRICATING DOUBLE SILICIDE GATE ELECTRODE STRUCTURES ON CMOS-FIELD EFFECT TRANSISTORS

BACKGROUND OF THE INVENTION

(1) Field of the Invention

The present invention relates to the fabrication of integrated circuit devices on semiconductor substrates, and more particularly relates to field effect transistors having gate electrodes with two silicide layers for improved electrical characteristics and processing latitude.

(2) Description of the Prior Art

As the semiconductor industry moves to smaller device feature sizes for ultra large scale integration (ULSI), the circuit performance is expected in general to improve. However, the increase in parasitic resistance due to the smaller feature sizes tends to limit this improved circuit performance. For example, in the past, field effect transistors (FETs) had gate electrodes and interconnecting lines made of polysilicon with widths that were greater than a micrometer (um). Now the widths are much less than half of a micrometer that result in high parasitic resistance.

The increase in parasitic resistance results in higher RC time delays and IR voltage drops in the interconnecting lines, which are too excessive for current day ULSI applications.

To circumvent these high resistance problems, it is common practice in the semiconductor industry to form the gate electrodes and interconnecting lines using a single polysilicon/silicide layer, commonly referred to as a polycide layer, in which the increased electrical conductivity of the silicide layer is used to reduce the line resistance. Several refractory metals suitable for forming these silicides for the gate electrodes and interconnections include tungsten (W) and titanium (Ti) metals. One method of forming silicide gate electrodes is described by Huang, et al. in U.S. Pat. No. 5,130,266 in which a tungsten/silicide (WSi$_2$) is formed by chemical vapor deposition (CVD) on the polysilicon layer, and is patterned to form the gate electrodes. Huang teaches a method for preventing the WSi$_2$ from peeling off the polysilicon layer. And further teaches the use of a thermally grown cap oxide (SiO$_2$) on the WSi$_2$ gate electrodes to facilitate the formation of a second silicide on the source/drain areas by depositing, and thermally reacting a second refractory metal, such as titanium (Ti). The cap oxide serves to prevent the Ti metal from reacting with WSi$_2$ silicide when the Ti is annealed to form the source/drain silicide contacts. The unreacted Ti is selectively removed over the insulating surfaces. In the more commonly used prior art methods for making WSi$_2$ gate electrodes, a polysilicon/silicide (polycide) layer having an insulating layer on the surface is patterned first. After forming sidewall spacers, a second refractory metal is deposited and annealed to form silicide source/drain contacts. However, this requires the etching of a polycide layer and an insulating layer in different plasma etchers to achieve good control of the critical dimensions (CD), such as the gate length (less than 0.25 um) and interconnecting line widths. Further, the wafer transfer between etchers can result in additional particle contamination and higher manufacturing cost.

Another prior art approach is to form the polycide gate electrodes and self-aligned source/drain silicide contacts using what is commonly referred to in the semiconductor industry as the SALICIDE process. In this approach, a single polysilicon layer is patterned to form the gate electrodes. After insulating sidewall spaces are formed adjacent to the electrodes and a single refractory metal, such as Ti, is deposited over a polysilicon gate and over the source/drain contact areas, the Ti is annealed to concurrently form the polycide gate electrodes and silicide source/drain contacts. The unreacted Ti is then selectively removed on the insulating surfaces, which also includes the Ti on the insulating sidewall spacers between gate electrodes and source/drain areas, to form the SALICIDE (self-aligned silicide) FET structure. However, when contacts are plasma etched to the gate electrode runner (the portion of the gate electrode extending over the field oxide area), removal of the thin TiSi$_2$ layer in the contact openings can result in increased contact resistance (R$_c$). Furthermore, variations in thickness in the TiSi$_2$ resulting from the selective removal of the unreacted Ti can result in variations in the line resistance. The above problems need to be addressed if integrated circuits with improved electrical performance and reliable manufacturing processes are to be achieved.

SUMMARY OF THE INVENTION

A principal object of this invention is to provide a process for making double silicide gate electrodes having self-aligned silicide source/drain contacts with low contact resistance and high electrical conductivity in the gate electrodes and interconnecting lines (runners).

It is another object of this invention to better control the critical dimensions (CD) of the gate electrode length by circumventing the need to move the substrates (wafer) between plasma etchers during etching of the gate electrodes and interconnecting lines.

It is still another object of the invention to provide this FET structure by a simple and cost effective manufacturing process.

In summary then, the object of this invention is a method for fabricating improved FET gate electrodes and interconnecting lines having a double layer of silicide for ULSI CMOS-FETs. This double silicide layer in the gate electrodes and interconnecting lines significantly reduces the electrical resistance. The method also provides a means for forming more reliable electrical contacts to the gate electrodes having repeatable low contact resistance R$_c$. The inventive method also eliminates the need for using more than one etcher to perform the anisotropic plasma etch to form the gate electrodes, and therefore reduces particle contamination, and improves the control of the critical dimension (CD), more specifically the gate electrode length.

The method starts by providing a single crystal semiconductor substrate doped with a P-type dopant, such as boron, and having device areas on the substrate surface, surrounded and electrically isolated by Field OXide (FOX) areas in and on which N-channel FETs are fabricated. Also by including twin-wells in a lightly doped N$^-$ type or P$^-$ type substrate, both N-channel and P-channel FETs having these improved double silicide layer gate electrodes can be made from which can be fabricated CMOS integrated circuits with improved performance. A gate oxide layer is thermally grown on the device areas for the FETs. A first polysilicon layer is deposited on device areas and over the field oxide, and then the polysilicon is heavily doped by ion implantation. The polysilicon is deposited by low pressure chemical vapor deposition (LPCVD). By using appropriate ion-implant blockout masks, both N-type and P-type dopants can be introduced into the first polysilicon layer for both N-channel and P-channel FETs. Next, a first silicide layer is deposited on the first polysilicon layer, such as a chemical vapor deposited (CVD) tungsten silicide (WSi$_2$). After depositing the first silicide layer, a second polysilicon layer is deposited similar to the first polysilicon layer, and is also doped by ion implantation to provide either N-type or P⁻ type conductivity. The multilayer comprised of the second polysilicon layer, the first silicide layer and the first polysilicon layer is then patterned to form the FET gate electrodes and to form the interconnecting lines over the field oxide areas. Conventional photolithographic techniques and anisotropic plasma etching can be used to pattern the multilayer. Since this inventive method does not require a cap oxide on the multilayer, the etching can be carried out in a single etching step. This eliminates the need for etching in an oxide etcher and in a polysilicon etcher to achieve reasonable gate critical dimension (CD) control, and particle contamination is minimized. Lightly doped source/drain areas are formed adjacent to the gate electrodes in the device areas by ion implantation. Next, insulating sidewall spacers are formed by depositing a conformal insulating layer over the gate electrodes and anisotropically etched back to form the spacers. The insulating layer can be composed of a silicon oxide, but silicon nitride, silicon oxynitride, or a combination of any of these films can also be used. Heavily doped source/drain contact areas are formed in the device areas adjacent to the sidewall spacers using ion implantation. A refractory metal layer is deposited on the substrate over the gate electrodes and interconnecting lines and also on the device areas. The refractory metal layer contacts the exposed top of the second polysilicon layer in the gate electrodes, and also contacts the exposed FET source/drain contact areas. The preferred refractory metal is titanium (Ti). The Ti metal is then thermally annealed to form a silicide layer with the second polysilicon layer on the gate electrodes, and concurrently forms silicide contacts in and on the source/drain contact areas. The unreacted Ti left on the surface of the insulating layers, such as the insulating sidewall spacers and field oxide areas, is removed selectively, for example, by using a wet etch. This now completes the double silicide gate electrodes and interconnecting lines and self-aligned silicide source/drain contact areas by the method of this invention.

One of the advantages of this invention is that more reliable contacts to the gate electrodes can be made in the insulating layer over a titanium silicide layer on the gate electrodes because of the additional tungsten silicide layer in the gate. This advantage applies even if the contact openings are overetched in the top titanium silicide layer.

To complete the method up to the first metal level, a passivation layer is deposited over the FETs and interconnecting lines to form the polysilicon/metal 1 dielectric (PMD). For example, the passivation layer can be composed of a silicon oxide ($SiO_2$) and/or a low flow temperature glass such as borophosphosilicate glass (BPSG). The contacts to the FET gate electrodes and to other desired areas on the substrate are then formed using conventional photolithographic techniques and anisotropic plasma etching. Overetching the contact openings to the gate electrodes and inadvertently removing the titanium silicide is not critical since the tungsten silicide layer thereunder provides a good electrical conducting path for the low contact resistance ($R_c$). Another conducting layer, such as aluminum (Al) or an aluminum alloy, is deposited and patterned to complete the structure up to the next level of interconnecting lines.

BRIEF DESCRIPTION OF THE DRAWINGS

The embodiment of this invention is best understood with reference to the following drawings.

DESCRIPTION OF THE PREFERRED EMBODIMENTS

Referring now to FIGS. 1 through 4, the preferred embodiment is shown for making a double silicide gate electrode having improved electrical characteristics. The process in described for making only N-channel FETs on a P-doped silicon substrate, but it should be well understood by those skilled in the art that P-channel FETs can also be fabricated by reversing the conductive polarity, that is, by reversing the dopant types and adjusting appropriately the dopant concentrations. It should also be understood that by including both N and P type well regions in an N⁻ or P⁻ substrate, and by including additional selective implant steps, that both N- and P-channel FETs having these double silicide gate electrodes can be fabricated simultaneously on the same substrate, and that CMOS circuits can be formed therefrom.

Figure 1:
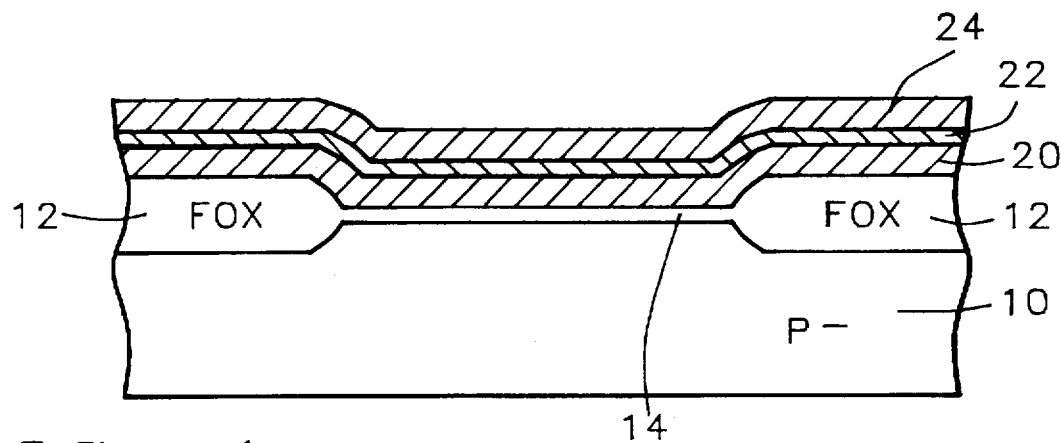
FIGS. 1 through 4 show a cross-sectional schematic that illustrate the method of this invention for making an N-channel FET having gate electrodes and interconnecting lines formed a double silicide layer.

Referring to FIG. 1, the method starts by forming a patterned Field OXide (FOX) 12 on a P⁻ type single crystal semiconductor substrate 10 surrounding and electrically isolating device areas in which the field effect transistors (FETs) are formed. The method commonly practiced in the semiconductor industry for forming the field oxide 12 is referred to as the LOCal Oxidation Of Silicon (LOCOS). This method consists of using a thin thermal oxide (pad oxide) and a silicon nitride layer on the substrate surface as an oxidation-resistant mask (the pad oxide and nitride layers are not shown in FIG. 1). The desired field oxide areas are etched open in the oxide/nitride layer while retaining the nitride layer over the device areas using conventional photolithographic techniques. The substrate 10 is then ion implanted in the field oxide areas with P-type dopant to provide channel stoppers, and then subjected to an oxidizing ambient, such as a steam oxidation, to thermally grow the field oxide 12, as shown in FIG. 1. The field oxide is typically grown to a thickness of between about 4000 and 6000 Angstroms. The FET devices having the double silicide gate electrodes are then fabricated on the silicon substrate in the non-oxide device areas, after removing the silicon nitride and pad oxide layers. For example, the silicon nitride can be removed in a solution of heated phosphoric acid ($H_3PO_4$) and the thin pad oxide in a dilute hydrofluoric acid (HF). The gate oxide 14 for the FETs is formed first by forming a good-quality oxide in the device areas, usually by using a dry thermal oxidation. The gate oxide 14 is grown to a thickness of between about 90 and 200 Angstroms.

Still referring to FIG. 1, a first polysilicon layer 20 is deposited over the gate oxide layer 14 and also over the field oxide areas 12. Preferably layer 20 is deposited by low pressure chemical vapor deposition (LPCVD) using a reactant gas such as silane ($SiH_4$). The thickness of layer 20 is between about 800 and 2000 Angstroms. Layer 20 is then conductively doped N-type using, for example ion implantation. For example, arsenic ($As^{75}$) or phosphorus ($p^{31}$) can be used as the dopant ions. After implanting, the preferred dopant concentration in layer 20 is between about 1.0 E 18 and 1.0 E 20 ions/cm³.

A first silicide layer 22 is deposited on the first polysilicon layer 20, the preferred silicide being tungsten silicide ($WSi_2$). One method for depositing the $WSi_2$ is by chemical vapor deposition (CVD) using, for example, tungsten hexafluoride ($WF_6$) and silane ($SiH_4$) as the reactant gases. The thickness of layer 22 is preferably between about 800 and 2000 Angstroms. This metal silicide layer 22 is very important to the invention, as will be seen later in the description, because it functions to further lower the line resistance in the gate electrodes and interconnecting lines, and thereby reduce the RI voltage drop and RC time constant—important for improving circuit performance. A second polysilicon layer 24 is deposited next on silicide layer 22. Layer 24 is deposited also using LPCVD and a reactant gas such as silane ($SiH_4$). Polysilicon layer 24 is also heavily doped with N type impurities, for example, using ion implantation of arsenic ($As^{75}$) or phosphorus ($p^{31}$) ions. After implantation, the final preferred N-dopant concentration in layer 24 is between about 1.0 E 18 and 1.0 E 20 ions/$cm^3$. Layer 24 is preferably deposited to a thickness of between about 300 and 1000 Angstroms.

Figure 2:
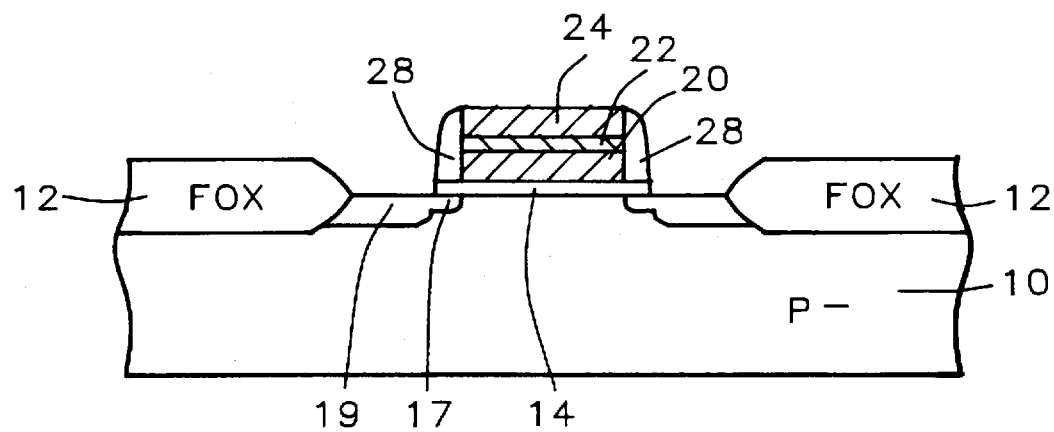

Referring now to FIG. 2, the multilayer comprised of the doped second polysilicon layer 24, the first silicide layer 22 ($WSi_2$), and the first polysilicon layer 20 is now patterned to partially complete the FET gate electrodes in the device areas and the interconnecting lines over the field oxide areas 12. The multilayer is patterned using a photoresist mask and anisotropic plasma etching to form electrodes having essentially vertical sidewalls. The preferred etching is performed in a low pressure plasma etcher. For example the multilayer can be patterned using a high density plasma (HDP) etcher or a reactive ion etcher (RIE) and a preferred etching gas mixture comprised of chlorine, helium and oxygen ($Cl_2$/He/$O_2$) and chlorine/hydrogen bromide ($Cl_2$/HBr). The etching, for example, can be carried out at a pressure of 4.0 milliTorr (mT) using a gas flow rate of 90 standard cubic centimeters per minute (sccm) of $Cl_2$, and 2 sccm of He/$O_2$, and the etching completed using an overetch at a pressure of 45–60 mT using a flow rate of 100–200 sccm of HBr, 3–5 sccm of He/$O_2$ and 100–150 sccm of He. A cap oxide is not required on polysilicon layer 24, therefore, the patterning of the multilayer can be carried out in a single etcher using the above gas mixtures. This eliminates the need to move the wafers between an oxide etcher and a polysilicon etcher to achieve the desired critical dimension (CD) control for the submicrometer gate electrode lengths on these submicrometer electrodes. The etching in a single chamber also minimizes particle contamination and process time.

After forming the gate electrodes, lightly doped source/drain areas 17 are formed adjacent to the gate electrodes in the device areas by ion implantation. The gate electrodes acting as an implant mask serve to self-align the implant to the electrodes. For example, the lightly doped drains can be formed using an N-type dopant such as phosphorus. Preferably, the phosphorus ($p^{31}$) ions are implanted at a dose of between about 1.0 E 12 to 1.0 E 14 ions/$cm^2$ using an ion energy in the range of between about 30 and 70 keV. The insulating sidewall spacers 28 are formed next on the sidewalls of the gate electrode. The spacers 28 are formed by depositing a conformal silicon oxide, such as by low pressure chemical vapor deposition (LPCVD) using a reactant gas such as tetraethosiloxane (TEOS), and is deposited at a temperature in the range of between about 600 and 750° C. Typically the $SiO_2$ is deposited to a thickness of about 1000 to 2000 Angstroms, and is them anisotropically etched back to form the sidewall spacers 28 also having a width at the base of the spacer of between about 0.05 and 0.2 um. Alternately, other dielectric layers can be used for the sidewall spacers such as silicon oxynitride, silicon nitride, or a combination thereof.

Referring still to FIG. 2, the heavily N doped source/drain contact areas 19 are formed next adjacent to the sidewall spacers 28. The sidewall spacers serve to mask the implant over the lightly doped source/drain areas 17, and thereby form source/drain contact areas 19 self-aligned to the spacers. The $N^+$source/drain can be formed by ion implantation using arsenic ($As^{75}$) with a dose of between about 1.0 E 15 to 1.0 E 16 ions/$cm^2$, and ion implant energies of about 40 to 100 keV.

Figure 3:
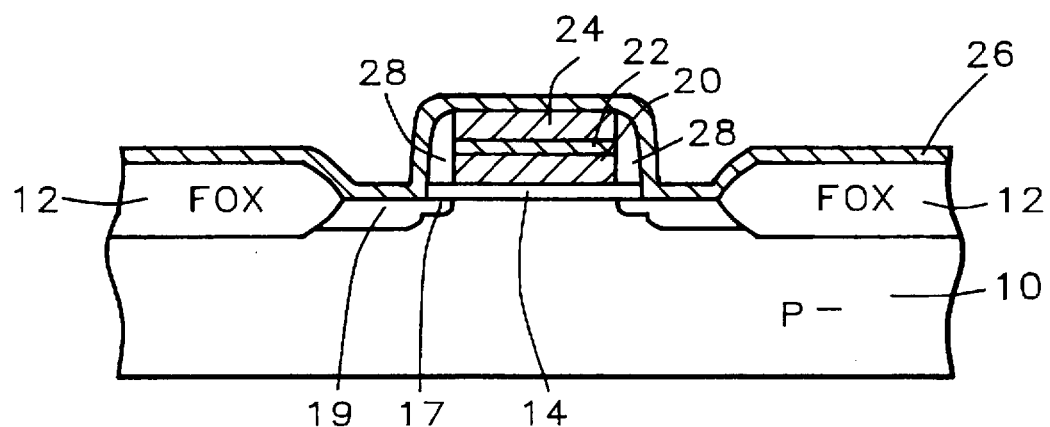

Referring now to FIG. 3, a blanket refractory metal layer 26 is deposited on the substrate contacting the surface of the patterned second polysilicon layer 24 forming part of the gate and interconnecting lines, and also in contact with the exposed device areas. Preferably layer 26 is titanium (Ti) and is deposited, for example, by sputter deposition using a Ti target. The thickness of the Ti is preferably between about 300 and 800 Angstroms.

Figure 4:
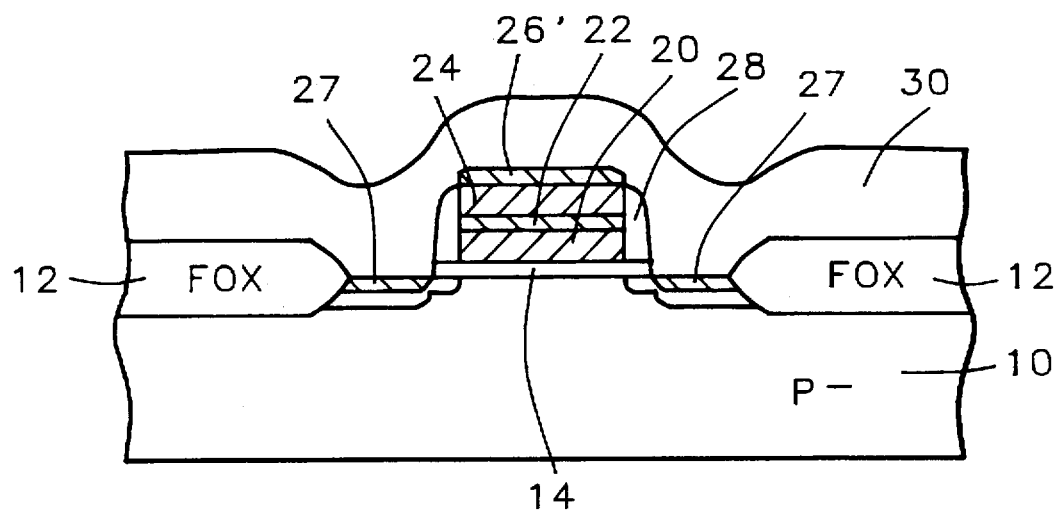

Referring now to FIG. 4, the titanium metal is then thermally annealed to form a second silicide layer 26'with the second polysilicon layer 24 on the gate electrodes, and concurrently forms the titanium silicide contacts 27 on and in the source/drain contact areas 19. The preferred anneal is carried out in a pure nitrogen ($N_2$) gas or pure forming gas (95% $N_2$+5% $H_2$). One preferred method of annealing can be carried out using rapid thermal processing (RTP) at a temperature in the range of 600 to 800° C. for a time between about 30 to 90 seconds. This first anneal is carried out at a relatively low temperature to prevent the diffusion of silicon in the Ti layer over the sidewall spacers, and thereby prevents bridging between the source/drain silicide contacts 27 and the $TiSi_2$ formed on the gate electrodes.

Referring still to FIG. 4, the unreacted Ti left on the surface of the insulating layers, such as the insulating sidewall spacers 28 and field oxide areas 12, is now selectively removed using a wet etch. The preferred wet etch is carried out at room temperature using a mixture of deionized water ($DiH_2$ O), 30 % hydrogen peroxide ($H_2$ $0_2$), and ammonium hydroxide ($NH_4OH$) (5:1:1). After removing the unreacted titanium (Ti), the $TiSi_2$ silicide is subjected to a stabilization anneal to reduce the $TiSi_2$ resistivity. For example, a rapid thermal anneal can be carried out at 1000 ° C. for 30 seconds in argon (Ar). The completed FETs having the double silicide layer gate electrodes and interconnecting lines are now insulated from the next level of interconnections by depositing an insulating layer 30 commonly designated in the industry as the polysilicon/metal 1 dielectric (PMD) layer. Preferably layer 30 is composed of silicon oxide ($SiO_2$) and if planarization or smoothing of the layer is desired, a low flow temperature glass can be used, such as BPSG. The BPSG is deposited by LPCVD using, for example, TEOS. Preferably layer 30 is deposited to a thickness of between about 3000 and 6000 Angstroms.

Figure 5:
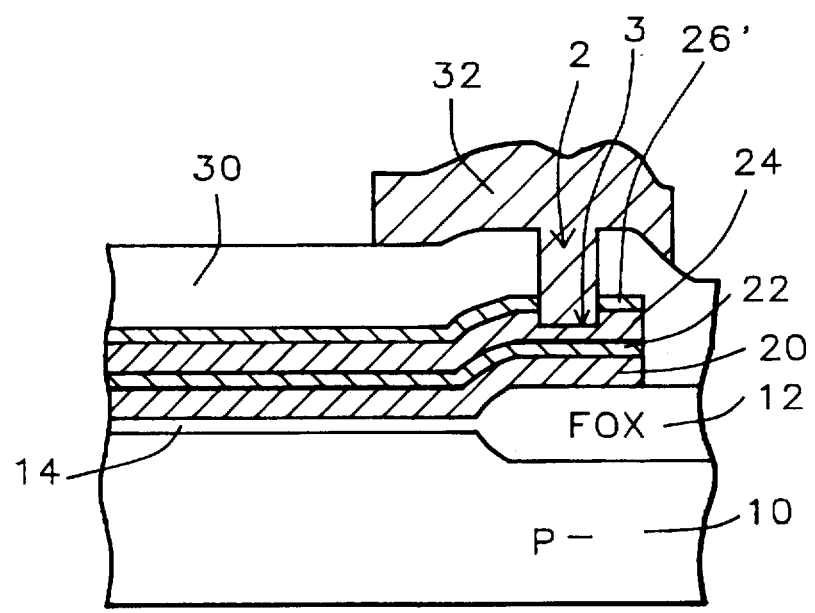
FIG. 5 shows a schematic cross-sectional view through a different portion of the inventive device showing a part of the double silicide gate electrode having a apart of the contact opening formed to the gate electrode extending over the field oxide area.

To better understand the importance of the invention, a schematic cross section is shown in FIG. 5 for a portion of the gate electrode, comprising layers 20, 22, 24, and 26 extending over the field oxide area 12. Shown is a contact opening 2 etched in the insulating layer 30 and extending into the top of the gate electrode. A metal 1, such as aluminum of Al—Cu alloy, is deposited and patterned to make electrical contact to the gate electrode in the contact opening 2. In general, it is difficult to control accurately the etch stop of the contact openings to the thin $TiSi_2$ layer 26, such as contact 3 in FIG. 5, particularly when million of contacts are simultaneously etched on each chip and on hundreds of chips on each silicon substrate. If the contacts are etched through the Ti silicide layer 26', in general the metal contact can have a high and non-repeatable contact resistance $R_c$. However, by the method of this invention, a heavily doped polysilicon layer 24 and tungsten silicide 22 is provided immediately below the contact opening 2 allowing more latitude in controlling the etch stop. The overetching in the gate electrode contact openings is therefore non-critical if the titanium silicide is removed, because the heavily doped polysilicon layer 24 and first tungsten silicide layer 22 thereunder provide a good electrical conducting path for the gate electrodes and interconnecting lines with low contact resistance ($R_c$).

While the invention has been particularly shown and described with reference to the preferred embodiments thereof, it will be understood by those skilled in the art that various changes in form and details may be made without departing from the spirit and scope of the invention.

What is claimed is:

1. A method for fabricating field effect transistor devices having a double silicide gate electrode comprising the steps of:

providing a semiconductor substrate doped with a conductive type dopant;

forming field oxide areas on said semiconductor substrate surrounding and electrically isolating device areas;

forming a gate oxide layer on said device areas; depositing a first polysilicon layer on said device areas and elsewhere on said field oxide areas; depositing a first silicide layer on said first polysilicon layer;

depositing a second polysilicon layer on said first silicide layer;

patterning said second polysilicon layer, said first silicide layer, and said first polysilicon layer by photoresist masking and anisotropic plasma etching thereby forming gate electrodes on said device areas and interconnecting lines on said field oxide areas;

forming lightly doped source/drain areas in said device areas adjacent to said gate electrodes by ion implantation;

forming insulating sidewall spacers upon the sidewalls of said gate electrodes;

forming heavily doped source/drain contact areas in said device areas adjacent to said insulating sidewall spacers by ion implantation;

depositing a conformal refractory metal layer on said substrate over said gate electrodes, said device areas, and said field oxide areas;

annealing said refractory metal layer and thereby forming a second silicide layer comprised in part of said second polysilicon layer on said gate electrodes and elsewhere on said interconnecting lines and concurrently forming said second silicide layer on said source/drain contact areas;

selectively etching said remaining refractory metal layer and thereby completing said field effect transistors having said double silicide gate electrodes and self-aligned silicided source drain contact areas.

2. The method of claim 1, where said first and second polysilicon layers are doped with N-type dopant.

3. The method of claim 1, wherein the thickness of said first polysilicon layer is between about 800 and 2000 Angstroms.

4. The method of claim 1, wherein said first silicide layer is composed of tungsten silicide having a thickness between about 800 and 2000 Angstroms.

5. The method of claim 1, wherein said second polysilicon layer has a thickness between about 300 and 1000 Angstroms.

6. The method of claim 1, wherein said refractory metal layer is titanium having a thickness between about 300 and 800 Angstroms.

7. The method of claim 1, wherein said refractory metal layer is annealed in nitrogen at a temperature between about 600° and 800 ° C. for a time of between about 30 and 90 seconds.

8. The method of claim 1, wherein both P and N doped source/drain field effect transistor devices are formed on said substrate to provide CMOS field effect transistor circuit capability.

9. A method for fabricating field effect transistor devices having a double silicide gate electrode comprising the steps of:

providing a semiconductor substrate doped with a conductive type dopant;

forming field oxide areas on said semiconductor substrate surrounding and electrically isolating device areas;

forming a gate oxide layer on said device areas;

depositing a first polysilicon layer on said device areas and elsewhere on said field oxide areas;

depositing a first silicide layer on said first polysilicon layer wherein said silicide layer is composed of tungsten silicide;

depositing a second polysilicon layer on said first silicide layer;

patterning said second polysilicon layer, said first silicide layer, and said first polysilicon layer by photoresist masking and anisotropic plasma etching thereby forming gate electrodes on said device areas and interconnecting lines on said field oxide areas;

forming lightly doped source/drain areas in said device areas adjacent to said gate electrodes by ion implantation;

forming insulating sidewall spacers upon the sidewalls of said gate electrodes;

forming heavily doped source/drain contact areas in said device areas; adjacent to said insulating sidewall spacers by ion implantation;

depositing a conformal refractory metal layer on said substrate over said gate electrodes, said device areas, and said field oxide areas, said refractory metal layer being composed of titanium;

annealing said refractory metal layer and thereby forming a second silicide layer comprised in part of said second polysilicon layer on said gate electrodes and elsewhere on said interconnecting lines and concurrently forming said second silicide layer on said source/drain contact areas;

selectively etching said remaining refractory metal layer and thereby completing said field effect transistors having said double silicide gate electrodes and self-aligned silicided source drain contact areas.

10. The method of claim 9, where said first and second polysilicon layers are doped with N-type dopant.

11. The method of claim 9, wherein the thickness of said first polysilicon layer is between about 800 and 2000 Angstroms.

12. The method of claim 9, wherein said tungsten silicide has a thickness between about 800 and 2000 Angstroms.

13. The method of claim 9, wherein said second polysilicon layer has a thickness between about 300 and 1000 Angstroms.

14. The method of claim 9, wherein said titanium has a thickness between about 300 and 800 Angstroms.

15. The method of claim 9, wherein said refractory metal layer is annealed in nitrogen at a temperature between about 600° and 800° C. for a time of between about 30 and 90 seconds.

16. The method of claim 9, wherein both P and N doped source/drain field effect transistor devices are formed on said substrate to provide CMOS field effect transistor circuit capability.

17. A method for fabricating field effect transistor integrated circuit devices having a double silicide gate electrode comprising the steps of:

providing a semiconductor substrate doped with a conductive type dopant;

forming field oxide areas on said semiconductor substrate surrounding and electrically isolating device areas;

forming a gate oxide layer on said device areas;

depositing a first polysilicon layer on said device areas and elsewhere on said field oxide areas;

depositing a first silicide layer on said first polysilicon layer;

depositing a second polysilicon layer on said first silicide layer;

patterning said second polysilicon layer, said first silicide layer, and said first polysilicon layer by photoresist masking and anisotropic plasma etching thereby forming gate electrodes on said device areas and interconnecting lines on said field oxide areas;

forming lightly doped source/drain areas in said device areas adjacent to said gate electrodes by ion implantation;

forming insulating sidewall spacers upon the sidewalls of said gate electrodes;

forming heavily doped source/drain contact areas in said device areas adjacent to said insulating sidewall spacers by ion implantation;

depositing a conformal refractory metal layer on said substrate over said gate electrodes, said device areas, and said field oxide areas;

annealing said refractory metal layer and thereby forming a second silicide layer comprised in part of said second polysilicon layer on said gate electrodes and elsewhere on said interconnecting lines and concurrently forming said second silicide layer on said source/drain contact areas;

selectively etching said remaining refractory metal layer and thereby forming said field effect transistors having said double silicide gate electrodes and self-aligned silicided source drain contact areas;

depositing a passivation layer over said field effect transistors and providing desired electrical connections to said gate electrodes and said source/drain contact areas to complete said integrated circuit devices.

18. The method of claim 17, where said first and second polysilicon layers are doped with N-type dopant.

19. The method of claim 17, wherein the thickness of said first polysilicon layer is between about 800 and 2000 Angstroms.

20. The method of claim 17, wherein said tungsten silicide has a thickness between about 800 and 2000 Angstroms.

21. The method of claim 17, wherein said second polysilicon layer has a thickness between about 300 and 1000 Angstroms.

22. The method of claim 17, wherein said titanium has a thickness between about 300 and 800 Angstroms.

23. The method of claim 17, wherein said refractory metal layer is annealed in nitrogen at a temperature between about 600° and 800 ° C. for a time of between about 30 and 90 seconds.

24. The method of claim 17, wherein both P and N doped source/drain field effect transistor devices are formed on said substrate to provide CMOS field effect transistor circuit capability.

25. A field effect transistor device with a double silicide gate electrode comprising of:

a semiconductor substrate doped with a conductive type dopant;

field oxide areas on said semiconductor substrate surrounding and electrically isolating device areas;

a gate oxide layer on said device areas;

a gate electrode and interconnecting lines patterned from a first polysilicon layer, a first silicide layer, a second polysilicon layer, and a second silicide layer;

said gate electrode having lightly doped source/drain areas adjacent to said gate electrodes and having insulating sidewall spacers thereon;

heavily doped source/drain contact areas with said second silicide layer in said device areas adjacent to said insulating sidewall spacers thereby providing said field effect transistors having said double silicide gate electrodes and self-aligned silicided source drain contact areas.

26. The structure of claim 25, wherein said first silicide layer is tungsten silicide ($WSi_2$).

27. The structure of claim 25, wherein said second silicide layer is titanium silicide ($TiSi_2$).

28. The structure of claim 25, wherein said titanium silicide is formed on said gate electrodes and on and in said source/drain contact areas by depositing titanium and thermal annealing.

29. The structure of claim 25, wherein both P and N doped source/drain field effect transistor devices are formed on said substrate to provide CMOS field effect transistor circuit capability.

* * * * *